United States Patent [19]
Ham

[11] Patent Number: 5,903,420
[45] Date of Patent: May 11, 1999

[54] ELECTROSTATIC DISCHARGE PROTECTING CIRCUIT HAVING A PLURALITY OF CURRENT PATHS IN BOTH DIRECTIONS

[75] Inventor: Seog-Heon Ham, Seoul, Rep. of Korea

[73] Assignee: Samsung Electronics, Co., Ltd, Suwon, Rep. of Korea

[21] Appl. No.: 08/963,238

[22] Filed: Nov. 3, 1997

[30] Foreign Application Priority Data

Nov. 2, 1996 [KR] Rep. of Korea ............ 96-51678

[51] Int. Cl.⁶ .................................................. H02H 9/00
[52] U.S. Cl. ............................ 361/56; 361/111; 257/355
[58] Field of Search ..................... 361/18, 56, 91, 361/111, 119; 257/107, 121, 122, 124, 126, 133, 146, 355

[56] References Cited

U.S. PATENT DOCUMENTS

| | | | |
|---|---|---|---|
| 5,140,401 | 8/1992 | Ker et al. | 257/43 |
| 5,600,525 | 2/1997 | Avery | 361/56 |
| 5,682,047 | 10/1997 | Consiglio et al. | 257/335 |

*Primary Examiner*—Ronald W. Leja
*Attorney, Agent, or Firm*—Marger Johnson & McCollom, P.C.

[57] ABSTRACT

An electrostatic discharge (ESD) protecting circuit for effectively discharging an overcurrent applied to a semiconductor circuit device, by providing a plurality of current paths. The ESD protecting circuit comprises a first discharging current path for discharging an overcurrent from the I/O pad to a first power supply, a second discharging current path for discharging the overcurrent from the I/O pad to a second power supply providing power for the internal circuit and a third discharging current path formed between the first power supply and the second power supply.

8 Claims, 4 Drawing Sheets

ELECTROSTATIC DISCHARGE PROTECTING CIRCUIT HAVING A PLURALITY OF CURRENT PATHS IN BOTH DIRECTIONS

FIELD OF THE INVENTION

The present invention relates to an electrostatic discharge protecting circuit in a semiconductor device, and more particularly to an electrostatic discharge protecting circuit having a plurality of current paths using a silicon controlled rectifier (hereinafter, referred to herein as an SCR) structure.

The present application is based on Korean Patent Application No. 96-51678 which is incorporated herein by reference for all purposes.

BACKGROUND OF THE INVENTION

In general, an electrostatic discharge protecting (referred to herein as an ESD) circuit has been widely used to prevent overcurrent from being applied to an internal circuit in a semiconductor device. Desired attributes of the ESD circuit are a low trigger voltage, a low holding voltage and a low dynamic resistance. Trigger voltage refers to the voltage level at which the SCR switches from a forward-blocking state to a forward conducting state. The holding voltage (or "snap-back voltage") refers to the momentary voltage drop of the SCR due to avalanche breakdown during SCR conduction.

Shown in FIG. 1 is a semiconductor device having a conventional ESD circuit of an SCR structure for satisfying the above requirements. Referring to FIG. 1, an input/output (I/O) pad is connected to an internal circuit 6 between a power supply Vdd and a ground voltage level Vss. Also, the input/output (I/O) pad is connected to an SCR 8, one terminal of which is connected to the internal circuit 6 and the other terminal of which is connected to the ground voltage level Vss. Typically, the SCR can be connected to either the power supply Vdd or the ground voltage level Vss. Here, the SCR will be illustrated with respect to only the connection to the ground voltage level Vss.

In the conventional ESD circuit, however, there are problems in that the trigger voltage is relatively high as compared with the low holding voltage and the low dynamic resistance. One design to reduce the trigger voltage of the ESD circuit to desired levels is proposed in EDL (Electron Device Letter) IEEE published in 1991 by Polygreen—called the LVTSCR (low voltage trigger SCR).

FIG. 2 is a cross-sectional view showing the LVTSCR structure proposed by Polygreen for reducing a high trigger voltage of the conventional ESD circuit The ESD circuit of the LVTSCR includes P-well and N-well regions 15 and 16 formed by implanting impurity ions into a semiconductor substrate 9 and field oxide layers 7a to 7e to define active and nonactive regions in the P-well and N-well regions 15 and 16. Further, the ESD circuit of the LVTSCR includes impurity regions 10 to 14 formed in the active regions by ion-implantation. The concentration of impurity regions 10 to 14 is higher than that in the well regions 15 and 16.

Impurity regions 13 and 14 in the N-well region 16 are connected to the I/O pad and impurity regions 10 and 11 in the P-well region 15 are connected to the ground voltage level Vss. The impurity region 12 is formed between the field oxide layers 7c and 7d, thereby being in contact with both the P-well region 15 and the N-well region 16.

In the above-mentioned ESD circuit of the LVTSCR structure, a first current path discharging the overcurrent is formed in the positive pulse as follows: $p^+$ (I/O pad) → $n^+$ (N-well region) → P-well region → $n^+$ (Vss). In case of a negative pulse, a second current path discharging the overcurrent is formed as follows: $n^+$ (N-well region) → P-well region (substrate).

FIG. 3 is an equivalent circuit diagram illustrating the ESD protecting circuit of the LVTSCR structure shown in FIG. 2. Referring to FIG. 3, the conventional ESD protecting circuit of the LVTSCR structure forms a PNPN diode between the I/O pad and the ground voltage level Vss and a PN diode 38 having an anode connected to the ground voltage level Vss and a cathode connected to the I/O pad.

FIG. 4 is an I–V characteristic curve of the conventional ESD protecting circuit of the LVTSCR structure shown in FIG. 2. As can readily be seen in FIG. 4, the trigger voltage, the holding voltage and the dynamic resistance of the LVTSCR are lower than those of the simple SCR structure, thus yielding an improved ESD device.

However, although the LVTSCR structure may improve the trigger voltage of a conventional ESD circuit, there still is an important drawback in that the discharging current paths for protecting the internal semiconductor device circuit are formed in only one direction.

SUMMARY OF THE INVENTION

Accordingly, it is an object of the present invention to provide an improved ESD protecting circuit having a plurality of discharging current paths in both directions.

Another object of the present invention is to provide an ESD protecting circuit having a new SCR structure capable of effectively preventing an internal circuit from being damaged from an ESD impact.

In accordance with an aspect of the present invention, there is provided an electrostatic discharge (ESD) protecting circuit formed between an input/output (I/O) pad and an internal circuit of a semiconductor device. The ESD protecting circuit constructed according to a preferred embodiment of the invention includes three discharge current paths. The circuit provides a first discharging current path for discharging an overcurrent from said I/O pad to a first power supply. A second discharging current path discharges the overcurrent from the I/O pad to a second power supply providing power for the internal circuit. Finally, a third discharging current path is formed between the first power supply and the second power supply.

In accordance with another aspect of the present invention, there is provided an electrostatic discharge (ESD) protecting circuit formed between an input/output (I/O) pad and an internal circuit of a semiconductor device. The ESD protecting circuit includes an N-well region formed on a semiconductor substrate and a P-well region formed on the semiconductor substrate adjacent to the N-well region. A first impurity region is formed in contact with both the P-well region and the N-well region. A first transistor, one terminal and the gate of which is coupled to the first power supply and the other terminal of which is coupled to the I/O pad, discharges an overcurrent from the I/O pad in response to a voltage applied to a gate electrode thereof. A second transistor, one terminal and the gate of which is coupled to the second power supply and the other terminal of which is coupled to the I/O pad, discharges the overcurrent in response to a voltage applied to a gate electrode thereof. A second impurity region formed on the P-well region is electrically coupled to the first power supply and to one terminal of the first transistor. A third impurity region formed on the N-well region is electrically coupled to the second power supply and to one terminal of the second transistor. A first insulating layer isolates the first impurity region from the first transistor. Finally, a second insulating layer isolates the first impurity region from the second transistor.

In accordance with another aspect of the present invention, the electrostatic discharge (ESD) protecting circuit formed between an input/output (I/O) pad and an internal circuit of a semiconductor device is similar to the preferred embodiment described above. The gates of the first and second transistors, however, are not coupled to the first and second power supply respectively but are instead floated. Such transistors are referred to herein as "floating gate transistors."

BRIEF DESCRIPTION OF THE DRAWINGS

Other objects and aspects of the present invention will become apparent from the following description of embodiments with reference to the accompanying drawings in which.

DETAILED DESCRIPTION OF PREFERRED EMBODIMENTS

Hereinafter, the present invention will be described below referring to the accompanying drawings.

Figure 1:
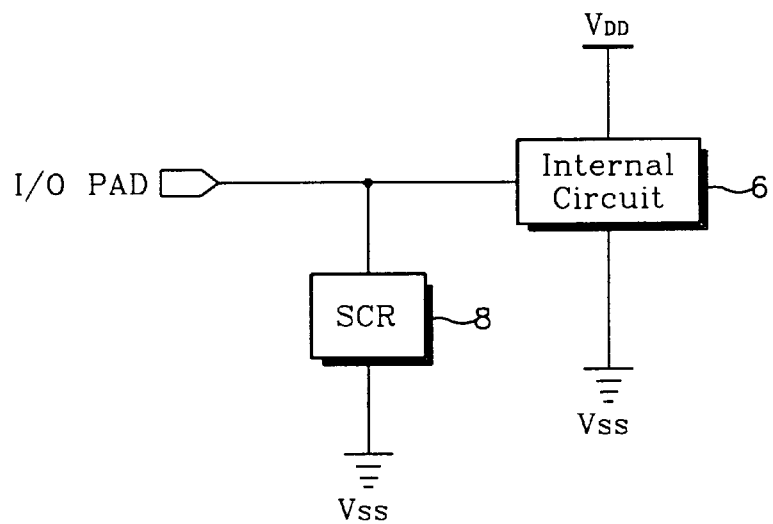
FIG. 1 is a schematic circuit diagram illustrating a semiconductor device having a conventional ESD protecting circuit.
Figure 2:
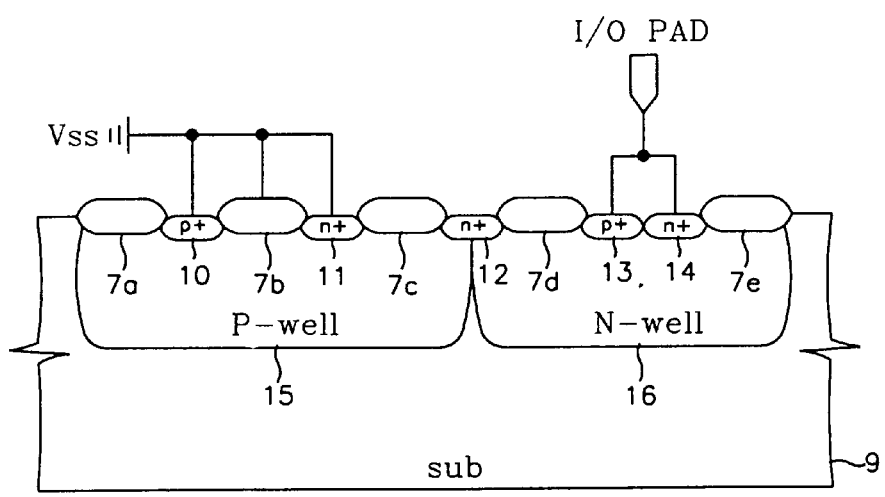
FIG. 2 is a sectional view illustrating a detailed structure of the ESD protecting circuit shown in FIG. 1.
Figure 3:
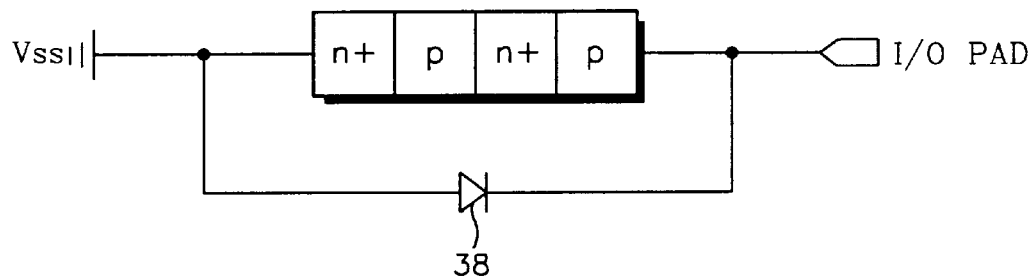
FIG. 3 is an equivalent circuit diagram illustrating the ESD protecting circuit shown in FIG. 2.
Figure 4:
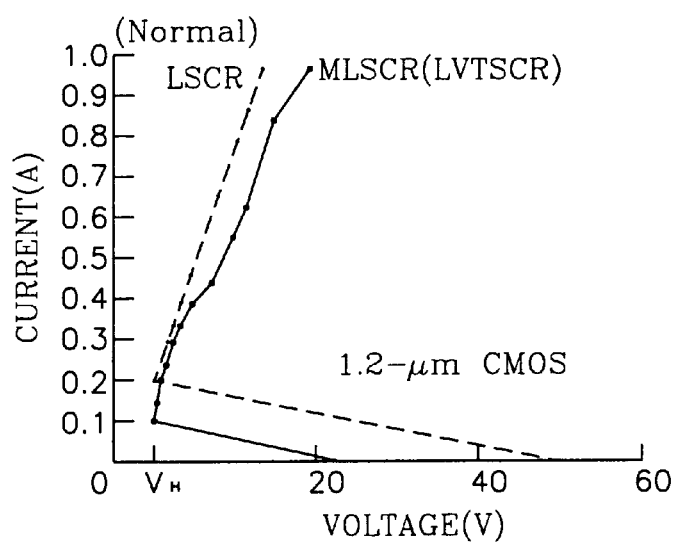
FIG. 4 is an I–V characteristic curve of the ESD protecting circuit shown in FIG. 2.
Figure 5:
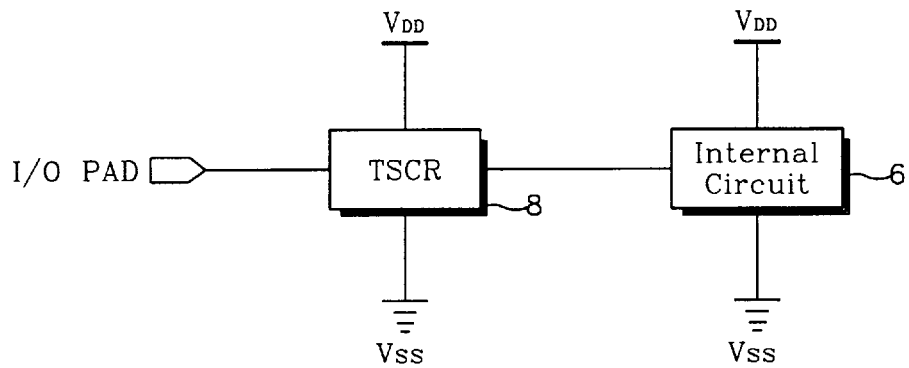
FIG. 5 is a schematic circuit diagram illustrating a semiconductor device having an ESD protecting circuit according to an embodiment of the present invention.

Referring to FIG. 5, a semiconductor device having an ESD protecting circuit according to one embodiment of the present invention includes an I/O pad, an internal circuit 6 and a Talent Silicon Controlled Rectifier (referred to herein as an TSCR) 8 formed between the I/O pad and the internal circuit 6 for discharging an ESD impact applied from an external circuit. Further, the TSCR 8 is connected to a ground voltage level Vss and a power supply Vdd.

Figure 6:
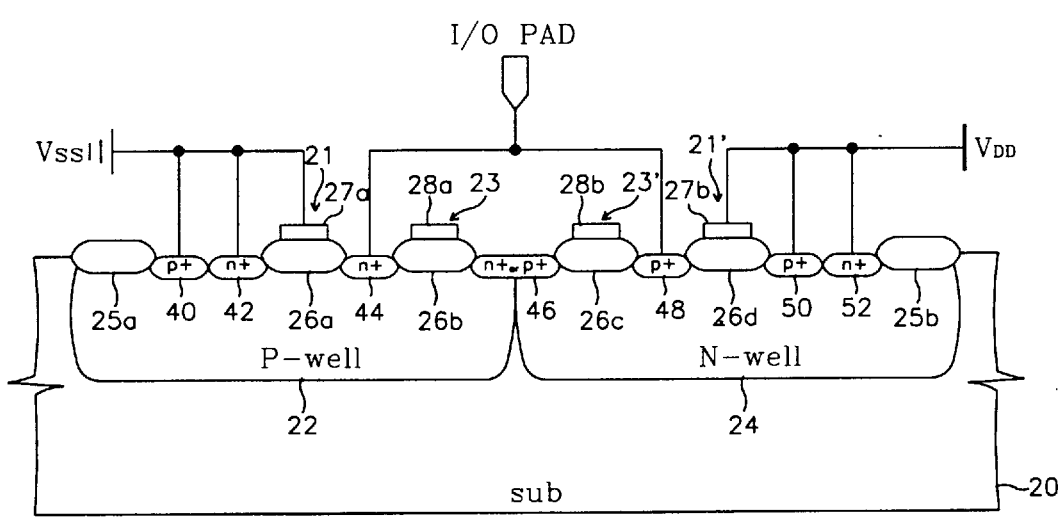
FIG. 6 is a sectional view illustrating a detailed structure of the ESD protecting circuit according to an embodiment of the present invention.

FIG. 6 is a sectional view showing a detailed TSCR structure according to an embodiment of the present invention. Referring to FIG. 6, a P-well region 22 is formed by implanting P-type impurity ions into a semiconductor substrate 20. Also, an N-well region 24 is formed by implanting N-type impurity ions into the semiconductor substrate 20 adjacent to the P-well region 22. For the isolation between active regions adjacent to the N-well and P-well regions 22 and 24, field oxide layers 25a and 25b are formed at end portions of the N-well and P-well regions 22 and 24 by applying the LOCOS (Local Oxidation of Silicon) process to the semiconductor substrate 20. A transistor 21, of which gate electrode 27a is coupled to the ground voltage level Vss, and another transistor 23, having a floating gate electrode 28a, are formed on the P-well region 22 of the semiconductor substrate 20. Also, a transistor 21', of which gate electrode 27b is coupled to the power supply Vdd, and another transistor 23', having a floating gate electrode 28b, are formed on the N-well region 24 of the semiconductor substrate 20.

The transistors 21 and 21', which respectively have gate electrodes 27a and 27b, provide current discharging paths to the ground voltage level Vss (the "first power supply") and the power supply Vdd (the "second power supply"), respectively. In the preferred embodiment, gate oxide layers 26a to 26d may be formed during the formation of the field oxide layers 25a and 25b.

Further, an $n^+$-type or $p^+$-type impurity region 46 is formed between the gate oxide layers 26b and 26c, thereby being in contact with both the P-well region 22 and the N-well region 24. An $n^+$-type impurity region 44, which is formed on the drain region of the transistor 21 in the P-well region 22, is connected to the I/O pad. A $p^+$-type impurity region 48, which is formed on the source region of the transistor 21' in the N-well region 24, is connected to the I/O pad together with the $n^+$-type impurity region 44.

An $n^+$-type impurity region 42, which is formed on the source region of the transistor 21 in the P-well region 22, is connected to the ground voltage level Vss. A $p^+$-type impurity region 50, which is formed on the drain region of the transistor 21' in the N-well region 22, is connected to the power supply Vdd. Furthermore, the $p^+$-type impurity region 50 and the $n^+$-type impurity region 52 are formed adjacent to one another in the same active area between the gate oxide layer 26d and the field oxide layer 25b. The $p^+$-type impurity region 40 and the $n^+$-type impurity region 42 are also formed adjacent to one another in the same active area between the gate oxide layer 26a and the field oxide layer 25a. In the preferred embodiment of the present invention, transistors 23 and 23', which respectively have gate electrodes 28a and 28b, function as floating gate transistors.

Figure 7:
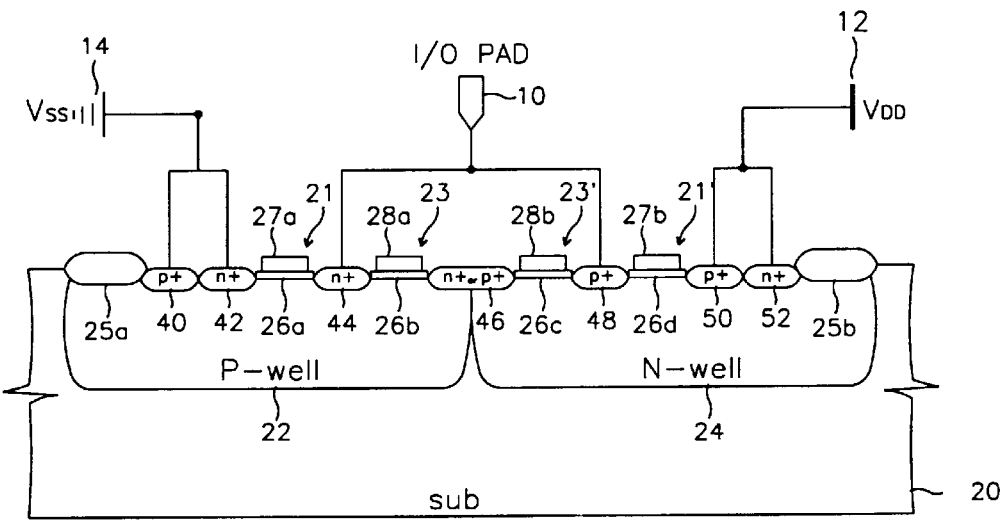
FIG. 7 is a sectional view illustrating a detailed structure of an ESD protecting circuit according to another embodiment of the present invention.

FIG. 7 is a sectional view showing a detailed TSCR structure according to another embodiment of the present invention. In FIGS. 6 and 7, the same reference numerals denote the same elements.

Another embodiment of the present invention is characterized in that the thickness of the gate oxide layers in FIG. 6 is different from that in FIG. 7. In other words, the gate oxide layers 26a to 26d shown in FIG. 6 are thick, but the gate oxide layers 26a to 26d shown in FIG. 7 are formed relatively thinly so that the transistors 21 and 21' are turned on at a low threshold voltage. As a result, the ESD protecting circuit according to the present invention can perform differently depending if a thin gate oxide layer is used or, alternately, the thick oxide layers formed in the LOCOS process for the gate oxide layers is used.

Figure 8:
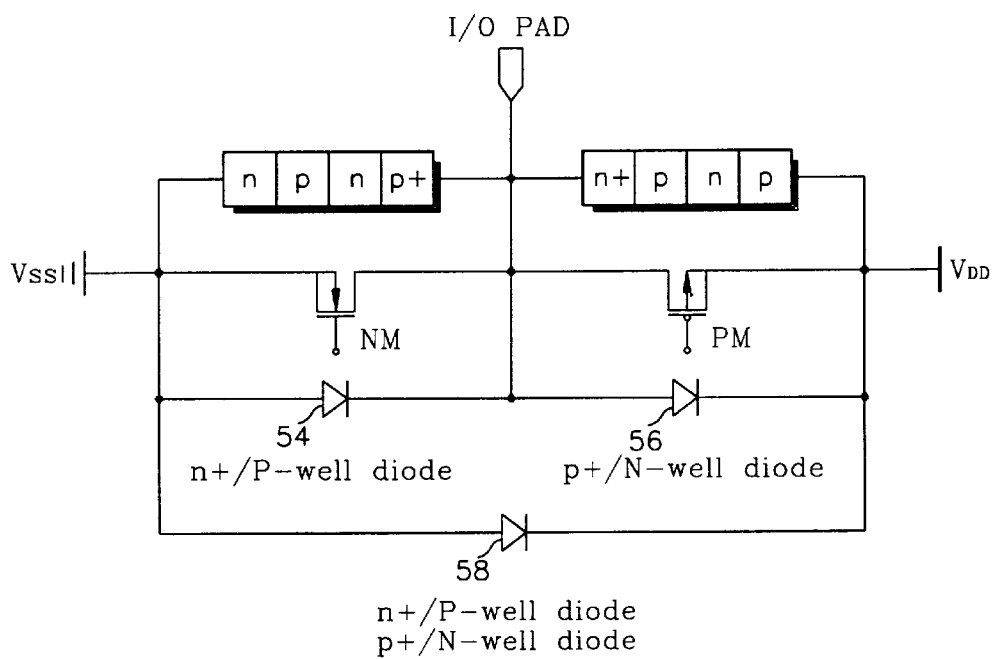
FIG. 8 is an equivalent circuit diagram illustrating the ESD protecting circuit shown in FIGS. 6 and 7.

FIG. 8 is an equivalent circuit diagram illustrating the ESD protecting circuit according to the present invention. As shown in FIG. 8, the ESD protecting circuit according to the present invention provides a plurality of discharging current paths in the direction of the ground voltage level Vss and the power supply Vdd. The current discharge to the ground voltage level Vss is carried out through a PNPN SCR, an N-channel MOSFET NM and an $n^+$/P-well diode 54. Similarly, the current discharge to the power supply Vdd is carried out through an NPNP SCR, a P-channel MOSFET PM and a $p^+$/N-well diode 56. In addition, because an n+/P-well diode or p+/N-well diode 58 caused by the formation of the n+-type or p+-type impurity region 46 is formed between the ground voltage level Vss and the power supply Vdd, it is possible to eliminate the processing steps in forming the power protection device.

The impurity region 46 may be doped either with n+ impurity ions or p+ impurity ions. In other words, the effects of the present invention are not affected by the doping type of the impurity region 46.

Referring to FIGS. 6, 7 and 8, if the impurity region 46 is first selected to be an n+ region, the p+, n, p and n regions of the PNPN SCR are formed with regions 48, 46, 22 and 42, respectively. The n+, p, n and p regions of the NPNP SCR are formed with regions 44, 22, 46 and 50. The source and drain regions of the N-MOSFET are formed with regions 42 and 44. The source and drain regions of the P-MOSFET are formed with regions 50 and 48. The anode and cathode of diode 54 are formed with regions 22 (or 40) and 44. The anode and cathode of diode 56 are formed with regions 48 and 24 (or 52). Finally, the anode and cathode of diode 58 are formed with regions 22 and 46.

If the impurity region 46 is selected to be a p+ region, the p+, n, p and n regions of the PNPN SCR are formed with regions 48, 24, 46 and 42 respectively. The n+, p, n and p regions of the NPNP SCR are formed with regions 44, 46, 24 and 50, and the anode and cathode of diode 58 are formed with regions 22 and 46, respectively.

The pnpn SCR, N-MOSFET (NM) and diode 54 permits ESD current to be discharged to a Vss terminal when positive excessive ESD impact is applied to the I/O pad. The npnp SCR, P-MOSFET (PM) and diode 56 permits ESD current to be discharged to a Vdd terminal when negative excessive ESD impact is applied to the I/O pad. Furthermore, a breakdown phenomenon is generated in the diode 58 when ESD impact is applied between the Vdd and Vss terminals, so that a voltage potential therebetween is stabilized. Most (about 70%) of ESD current produced by the ESD impact is discharged either through the PNPN SCR and N-MOSFET or the NPNP SCR and P-MOSFET, and the other of ESD current is discharged through the diode 58 (referred to as the "third discharging current path").

As apparent from the above description, the present invention provides an ESD protecting circuit for a semiconductor circuit device effectively removing an instant ESD impact, by providing various discharging current paths in the direction of the ground voltage level Vss and the power supply Vdd.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electrostatic discharge (ESD) protecting circuit formed between an input/output (I/O) pad and an internal circuit of a semiconductor device, said ESD protecting circuit comprising:

an N-well region formed on a semiconductor substrate;

a P-well region formed on said semiconductor substrate, being adjacent to said N-well region;

a first impurity region being in contact with both said P-well region and said N-well region;

a first transistor, one terminal of which is coupled to a first power supply and another of which is coupled to said I/O pad, for discharging an overcurrent from said I/O pad;

a second transistor, one terminal of which is coupled to a second power supply and another of which is coupled to said I/O pad;

a second impurity region formed on said P-well region to be electrically coupled to said first power supply, being coupled to one terminal of said first transistor;

a third impurity region formed on said N-well region to be electrically coupled to said second power supply, being coupled to one terminal of said second transistor;

a first insulating layer for isolating said first impurity region from said first transistor; and a second insulating layer for isolating said first impurity region from said second transistor.

2. The ESD protecting circuit in accordance with claim 1, wherein said second and third impurity regions are p+ and n+-type impurity regions, respectively.

3. The ESD protecting circuit in accordance with claim 2, wherein said first and second transistors are N-channel and P-channel MOSFETs, respectively, wherein said gate electrode of said N-channel MOSFET is coupled to said first power supply and wherein said gate electrode of said P-channel MOSFET is coupled to said second power supply.

4. The ESD protecting circuit in accordance with claim 3, wherein said first impurity region is a p+ or n+-type impurity region.

5. An electrostatic discharge (ESD) protecting circuit formed between an input/output (I/O) pad and an internal circuit of a semiconductor device, said ESD protecting circuit comprising:

an N-well region formed on a semiconductor substrate;

a P-well region formed on said semiconductor substrate, being adjacent to said N-well region;

a first impurity region being in contact with both said P-well region and said N-well region;

a first transistor, one terminal of which is coupled to a first power supply and another of which is coupled to said I/O pad, for discharging an overcurrent from said I/O pad in response to a voltage applied to a gate electrode thereof;

a second transistor, one terminal of which is coupled to a second power supply and another of which is coupled to said I/O pad, for discharging said overcurrent in response to a voltage applied to a gate electrode thereof;

a second impurity region formed on said P-well region to be electrically coupled to said first power supply, being coupled to one terminal of said first transistor; and a third impurity region formed on said N-well region to be electrically coupled to said second power supply, being coupled to one terminal of said second transistor.

6. The ESD protecting circuit in accordance with claim 5, wherein said second and third impurity regions are p+ and n+-type impurity regions, respectively.

7. The ESD protecting circuit in accordance with claim 6, wherein said first impurity region is a p+ or n+-type impurity region.

8. The ESD protecting circuit in accordance with claim 5, wherein said first and second transistors are NPN and PNP lateral Bipolar Transistors or NMOSFET and PMOSFET.

* * * * *